United States Patent
Xi

(10) Patent No.: US 7,426,150 B2
(45) Date of Patent: Sep. 16, 2008

(54) SENSE AMPLIFIER OVERDRIVING CIRCUIT AND SEMICONDUCTOR DEVICE USING THE SAME

(75) Inventor: Sung Soo Xi, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 11/275,161

(22) Filed: Dec. 16, 2005

(65) Prior Publication Data

US 2006/0221740 A1  Oct. 5, 2006

(30) Foreign Application Priority Data

Apr. 1, 2005  (KR) .................. 10-2005-0027749

(51) Int. Cl.
*G11C 7/02* (2006.01)

(52) U.S. Cl. .................. 365/207; 365/185.21; 365/206; 365/208

(58) Field of Classification Search ................. 365/207, 365/185.21, 206, 208
See application file for complete search history.

(56) References Cited

U.S. PATENT DOCUMENTS

| 6,477,100 | B2 | 11/2002 | Takemura et al. | |
|---|---|---|---|---|
| 6,853,593 | B1* | 2/2005 | Bae | 365/189.09 |
| 2004/0233754 | A1 | 11/2004 | Kwon | |
| 2005/0012636 | A1 | 1/2005 | Gallagher et al. | |
| 2005/0232052 | A1* | 10/2005 | Jin | 365/226 |
| 2006/0092735 | A1* | 5/2006 | Do et al. | 365/207 |

FOREIGN PATENT DOCUMENTS

| JP | 2003242780 | 8/2003 |
|---|---|---|
| JP | 2004170275 | 6/2004 |

* cited by examiner

*Primary Examiner*—Pho M. Luu
(74) *Attorney, Agent, or Firm*—Marshall, Gerstein & Borun LLP

(57) ABSTRACT

A sense amplifier overdriving circuit includes a first voltage driver which supplies an internal voltage from an internal voltage terminal to a sense amplifier in response to a first enabling signal, a logic unit which logically operates a block select signal for selection of a cell block and a second enabling signal enabled for a predetermined time after enabling of the first enabling signal, and outputs the resultant signal, and a second voltage driver which supplies an external voltage to the internal voltage terminal in response to the signal output from the logic unit. The sensing amplifier overdriving circuit may be used in a semiconductor device.

12 Claims, 3 Drawing Sheets

SENSE AMPLIFIER OVERDRIVING CIRCUIT AND SEMICONDUCTOR DEVICE USING THE SAME

FIELD OF THE INVENTION

The present invention relates to a sense amplifier overdriving circuit and a semiconductor device using the same, and, more particularly, to a sense amplifier overdriving circuit which overdrives sense amplifiers at the level of an external voltage for a predetermined period to prevent the internal voltage of the sense amplifiers from being abruptly dropped during operation of the sense amplifiers in such a manner that the overdriving operation is carried out only for sense amplifiers belonging to a currently-activated cell block, and a semiconductor device using the sense amplifier overdriving circuit.

DESCRIPTION OF THE RELATED ART

Semiconductor memory devices, which are used for storage of information, have advanced toward low cost, reduced size, and large capacity, in accordance with the technical advances in computer systems and electronic communication fields. Also, the developments of such semiconductor memory devices have advanced toward inhibition of unnecessary current consumption because of increased demand for enhanced energy efficiency.

Generally, the cell array of a dynamic random access memory (DRAM) device to store data includes a number of cells each of which includes one n-channel metal oxide semiconductor (NMOS) transistor and one capacitor that are connected to word lines and bit lines connected in the form of a net.

Hereinafter, operation of such a general DRAM device will be described in brief.

When a row address strobe (RAS) signal /RAS, which is a main signal to activate the DRAM device, transits to an active state (low-level state), address signals are inputted to a row address buffer. In this state, a row decoding operation is carried out to decode row address signals output from the row address buffer, and thus, to output a row address for selecting one of the word lines in the cell array.

When data of each cell connected to the selected word line is applied to a pair of bit lines, namely, a bit line BL and a complementary bit line /BL, connected to the cell, a sense amplifier enabling signal is enabled, thereby activating a sense amplifier driving circuit for a cell block selected by the row address. In accordance with operation of the activated sense amplifier driving circuit, respective bias potentials of a sense amplifier associated with the sense amplifier driving circuit are transitioned to a core potential Vcore and a ground potential Vss, so that the sense amplifier is activated. When the sense amplifier is activated, the potential difference between the bit lines BL and /BL, which has been kept minute, is amplified. Subsequently, a column decoder, which is selected by a column address, turns on a column transfer transistor which serves to transfer the data on the bit line BL and the data on the bit line /BL to data bus lines DB and /DB, respectively. Accordingly, the data transferred to the bit line BL and the data transferred to the bit line /BL are sent to the data bus lines DB and /DB, respectively. Thus, the data is outputted to the outside of the DRAM device.

That is, the bit lines BL and /BL of each bit line pair is in a state of being precharged to ½ Vcc before the semiconductor memory device operates, namely, in the standby mode. When the bit lines BL and /BL receive data from the associated cell in accordance with operation of the semiconductor memory device, the potentials of the bit lines BL and /BL are varied to have minute differences. When the sense amplifier connected to the bit lines BL and /BL begins to operate in the above state, the potentials of the bit lines BL and /BL are varied to a core potential Vcore and a ground potential Vss, respectively. Namely, amplification of the data on the bit lines BL and /BL is carried out. The amplified data from the bit line BL and the amplified data from the bit line /BL are sent to the data bus lines DB and /DB in accordance with a column decoder output signal yi, respectively.

In the above-mentioned conventional semiconductor memory device, however, a large amount of current is abruptly consumed at the point of time when the sense amplifier begins to operate in accordance with reception of the internal voltage, namely, a core voltage, VCORE. As a result, there is a problem in that the internal voltage VCORE is abruptly dropped. In order to solve this problem, a method, in which the external and internal voltage terminals of the semiconductor memory device are short-circuited at the point of time when the sense amplifier operates such that an external voltage is supplied to the internal voltage terminal, has been widely used. This method is referred to as "sense amplifier overdriving", and the circuit, which achieves such sense amplifier over driving, is referred to as a "sense amplifier overdriving circuit." In conventional sense amplifier overdriving methods, however, an external voltage is applied to each cell block of a cell array irrespective of whether or not the cell block is in operation. As a result, the current consumption in execution of the sense amplifier overdriving operation is unnecessarily excessive, thereby causing degradation in the energy efficiency of the semiconductor device (as seen in FIG. 4).

SUMMARY OF THE INVENTION

A sense amplifier overdriving circuit overdrives sense amplifiers at the level of an external voltage for a predetermined period to prevent the internal voltage of the sense amplifiers from abruptly dropping during operation of the sense amplifiers. The sense amplifier overdriving circuit operates in such a manner that the overdriving operation is carried out only for sense amplifiers belonging to a currently-activated cell block. Also descrived is a semiconductor device using the sense amplifier overdriving circuit.

A sense amplifier overdriving circuit in accordance with a described embodiment may include a first voltage driver which supplies an internal voltage from an internal voltage terminal to a sense amplifier in response to a first enabling signal; a logic unit which logically operates a block select signal for selection of a cell block and a second enabling signal enabled for a predetermined time after enabling of the first enabling signal, and outputs the resultant signal; and a second voltage driver which supplies an external voltage to the internal voltage terminal in response to the signal output from the logic unit.

A semiconductor device in accordance with a described embodiment may include a plurality of sense amplifier overdriving circuits each adapted to overdrive sense amplifiers at an external voltage level for a predetermined period, so as to prevent abrupt internal voltage drop during operation of the sense amplifiers. Each of the sense amplifier overdriving circuits may include a first voltage driver which supplies an internal voltage from an internal voltage terminal to at least one of the sense amplifiers associated with the sense amplifier overdriving circuit in response to a first enabling signal; a logic unit which logically operates a block select signal for selection of a cell block and a second enabling signal enabled for a predetermined time after enabling of the first enabling signal, and outputs the resultant signal; and a second voltage driver which supplies an external voltage to the internal voltage terminal in response to the signal output from the logic unit.

The second voltage driver may be turned on when both the block select signal and the second enabling signal are enabled.

The logic unit may NAND the block select signal and the second enabling signal.

The second voltage driver may be a p-channel metal oxide semiconductor (PMOS) device.

The logic unit may AND the block select signal and the second enabling signal.

The second voltage driver may be an n-channel metal oxide semiconductor (NMOS) device.

The first enabling signal may be a sense amplifier enabling signal to control operation of the sense amplifier.

The second enabling signal may be a sense amplifier overdriving signal to control whether or not overdriving of the sense amplifier is enabled.

BRIEF DESCRIPTION OF THE DRAWINGS

Numerous features and advantages of the present invention will become more apparent after reading the following detailed description when taken in conjunction with the drawings, in which.

DETAILED DESCRIPTION

Hereinafter, the present invention will be described with reference to exemplary embodiments. These embodiments are used only for illustrative purposes, and the present invention is not limited thereto.

Figure 1:
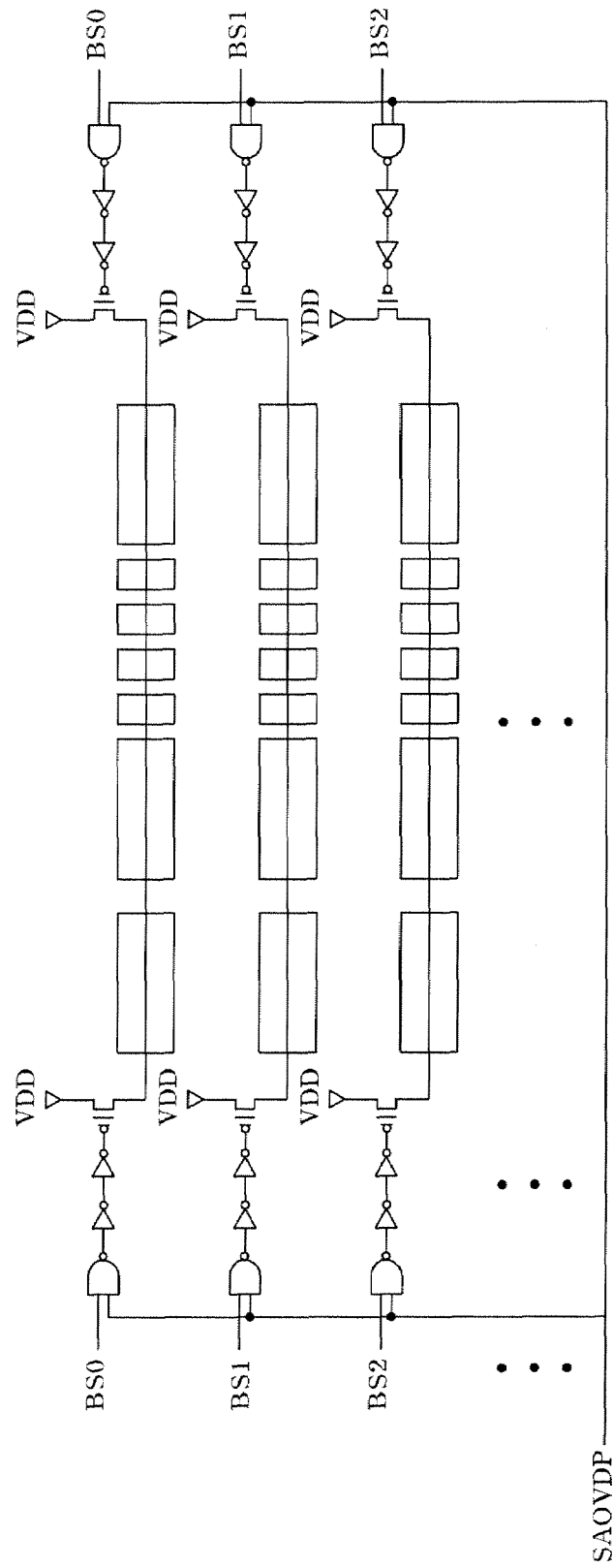
FIG. 1 is a circuit diagram illustrating a semiconductor device according to a described embodiment.
Figure 2:
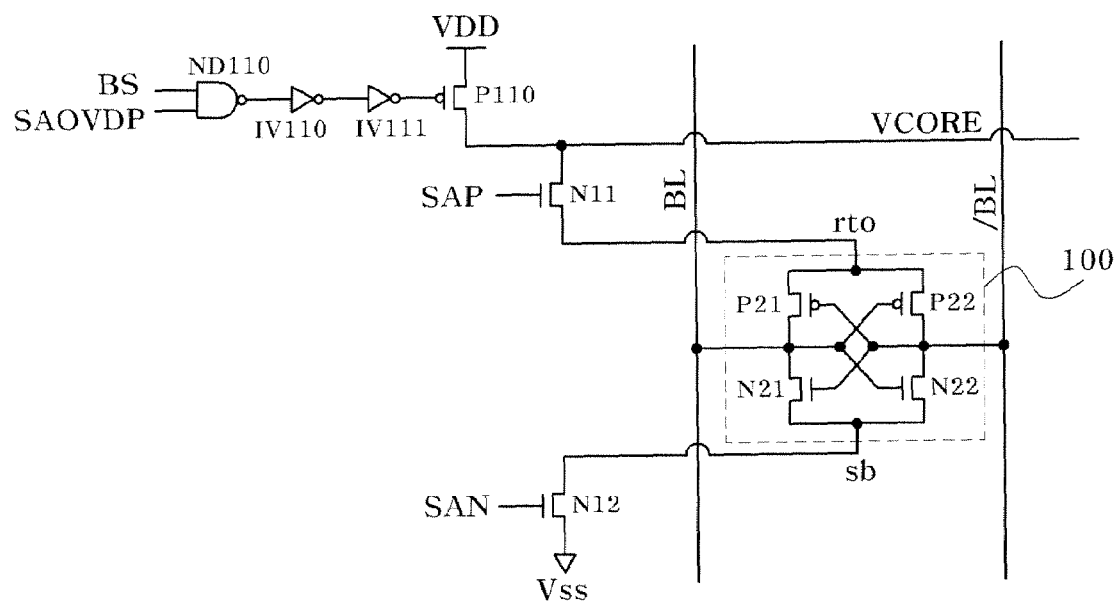
FIG. 2 is a circuit diagram illustrating a sense amplifier overdriving circuit according to a described embodiment.

FIG. 1 is a circuit diagram illustrating a semiconductor device according to a described embodiment. FIG. 2 is a circuit diagram illustrating a sense amplifier overdriving circuit according to a described embodiment.

As shown in FIG. 2, the sense amplifier overdriving circuit according to the illustrated embodiment includes an NMOS transistor N11 which is a voltage driver to supply an internal voltage VCORE from an internal voltage terminal to a sense amplifier 100 in response to a sense amplifier enabling signal SAP, a NAND gate ND110 that NANDs a block select signal BS for selection of a desired cell block and a sense amplifier overdriving signal SAOVDP enabled for a predetermined time after enabling of the sense amplifier enabling signal SAP, and outputs the resultant signal, and a p-channel MOS (PMOS) transistor P110 that is a voltage driver to supply an external voltage VDD to the internal voltage terminal in response to the signal output from the NAND gate ND110.

As shown in FIG. 1, the semiconductor device may include a plurality of sense amplifier overdriving circuits, each of which serves to overdrive a sense amplifier at the level of an external voltage VDD for a predetermined period, in order to prevent an abrupt drop in the internal voltage VCORE during operation of the sense amplifier. Each sense amplifier overdriving circuit may have the configuration of FIG. 2. That is, each sense amplifier overdriving circuit may include an NMOS transistor N11 that is a voltage driver to supply an internal voltage VCORE from an internal voltage terminal to at least one sense amplifier 100 in response to a sense amplifier enabling signal SAP, a NAND gate ND110 that NANDs a block select signal BS for selection of a desired cell block and a sense amplifier overdriving signal SAOVDP enabled for a predetermined time after enabling of the sense amplifier enabling signal SAP, and outputs the resultant signal, and a PMOS transistor P110 that is a voltage driver to supply an external voltage VDD to the internal voltage terminal in response to the signal output from the NAND gate ND110.

Figure 3:
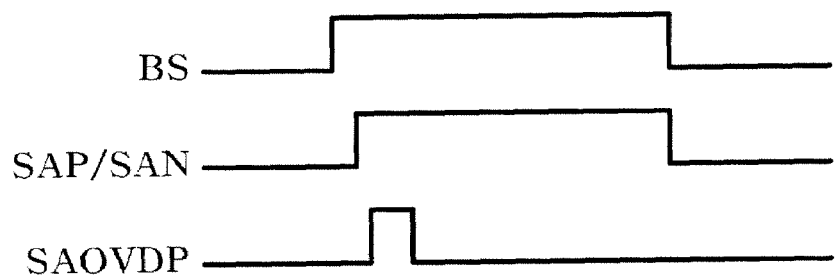
FIG. 3 is a timing diagram of signals used in the sense amplifier overdriving circuit according to the illustrated embodiment.

The block select signal BS is a signal that selects a cell block corresponding to a desired one of the cell array regions enabled by a one word line. As shown in FIG. 3, the block select signal BS selects a cell block desired to be enabled for an active operation period, namely, a data input/output operation, to perform input or output of data. The sense amplifier enabling signal SAP is an enabling signal that is enabled simultaneously with an enabling signal SAN after enabling of the block select signal BS, to enable supply of a voltage to the sense amplifier 100, as shown in FIG. 3. Also, the sense amplifier overdriving signal SA is enabled at the point of time when the sense amplifier 100 begins to operate after enabling of the sense amplifier enabling signal SAP, and is then disabled after a predetermined time. For the predetermined time, for which the sense amplifier overdriving signal SA is enabled, the external voltage is applied to the internal voltage terminal to overdrive the sense amplifier 100.

Operation of the semiconductor device according to the above-described configuration will be described in detail with reference to FIGS. 1 to 4. For simplicity, the following description will be given only in conjunction with one sense amplifier overdriving circuit to overdrive one sense amplifier.

When the semiconductor device is in a standby mode prior to operation thereof, a pair of bit lines connected to the sense amplifier 100, namely, bit lines BL and /BL, are pre-charged to ½ Vcc. In this state, the sense amplifier enabling signal SAP, enabling signal SAN, sense amplifier overdriving signal SAOVDP, and block select signal BS are all in a disabled state, namely, a low level state, as shown in FIG. 3. Accordingly, the NMOS transistor N11, NMOS transistor N12, and PMOS transistor P110 are all in an OFF state, and the sense amplifier 100 is in an inactive state.

The semiconductor device may be switched to an active mode, in which the semiconductor device performs an active operation such as input or output of data. In this mode or state, if the cell block selected by the block select signal BS is in a state of performing an active operation, namely, in an active state, the block select signal BS transits to a high level to be enabled. Immediately after this transition, the sense amplifier enabling signal SAP and enabling signal SAN transit to a high level to be enabled. In order to overdrive the sense amplifier 100 at the level of the external voltage VDD, the sense amplifier overdriving signal SAOVDP is also enabled for a predetermined time. Accordingly, the sense amplifier 100 is overdriven by the external voltage VDD for the predetermined time from the point of time when the sense amplifier 100 begins to operate, so as to prevent the internal voltage VCORE from dropping abruptly.

The current consumption in the overdriving operation may be remarkably reduced, as compared to conventional cases, by controlling the overdriving operation using block select signals BS such that the overdriving operation is carried out only for cell blocks in an active state. This will be described in detail hereinafter.

As shown in FIG. 1, each PMOS transistor, which is a voltage supply driver to supply an external voltage to an associated cell block, operates in response to a signal generated in accordance with a logic operation for an associated one of the block select signals BS0, BS1, BS2, . . . to select respective cell blocks and the sense amplifier overdriving signal SAOVDP.

This will be described in more detail with reference to FIG. 2. For simplicity, the following description will be given only for one block select signal. If the cell block selected by the block select signal BS is in an active state, the block select signal BS transits to a high level simultaneously with enabling of the active mode, as shown in FIG. 3. Also, the sense amplifier overdriving signal SAOVDP transits to a high level, namely, an enabling state, and is maintained in the enabling state for a predetermined time. As a result, the NAND gate ND110 in FIG. 2 outputs a low-level signal. The signal output from the NAND gate ND110 is buffered by inverters IV110 and IV111, and is then applied to the gate of the PMOS transistor P110. Accordingly, the PMOS transistor P110 is turned on, to supply the external voltage VDD to the internal voltage terminal. Thus, the cell block selected by the block select signal BS is overdriven by the external voltage VDD at the point of time when the associated sense amplifier 100 begins to operate, so that there is no phenomenon where the potential at the internal voltage terminal drops abruptly.

Figure 4:
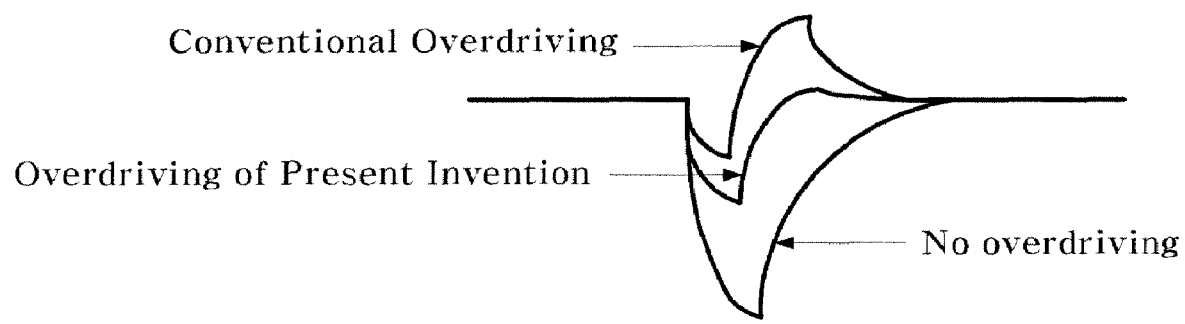
FIG. 4 is a graph depicting a variation in the voltage level at an internal voltage (VCORE) terminal during operation of the sense amplifier in the semiconductor device according to the illustrated embodiment, as compared to that of a conventional case.

On the other hand, if the cell block selected by the block select signal BS is not in a state of performing an active operation, namely, is in an inactive state, the block select signal BS is maintained in a low-level state even when the active mode is enabled, contrary to the case of FIG. 3. In this state, the NAND gate ND110 in FIG. 2 outputs a high-level signal irrespective of the transition of the sense amplifier overdriving signal SAOVDP to a high level, namely, an enabled state. The PMOS transistor P110, which receives, at the gate thereof, the signal output from the NAND gate ND110 and buffered by the inverters IV110 and IV111, is turned off, to prevent the external voltage VDD from being supplied to the internal voltage terminal. Thus, no overdriving is carried out in the cell block which is in an inactive state. FIG. 4 depicts a variation in the voltage level at the internal voltage terminal during operation of the sense amplifier in the semiconductor device according to the present invention, as compared to that of the conventional case. Referring to FIG. 4, it can be seen that it is possible to prevent excessive overdriving.

Thus, the sense amplifier overdriving circuit and the semiconductor device using the sense amplifier overdriving circuit may reduce the current consumption in overdriving sense amplifiers at the level of the external voltage by enabling the overdriving operation for sense amplifiers belonging to cell blocks in an active state, and disabling the overdriving operation for sense amplifiers belonging to cell blocks in an inactive state.

When the sense amplifier overdriving signal SAOVDP subsequently transits from a high level to a low level, as shown in FIG. 3, the output of the NAND gate ND110 in FIG. 2 becomes a high level, so that the PMOS transistor P110 is turned off. Accordingly, the overdriving operation for the sense amplifier associated with the active cell block is completed, and the potential at the internal voltage terminal is maintained at the level of the internal voltage VCORE.

Figure 5:
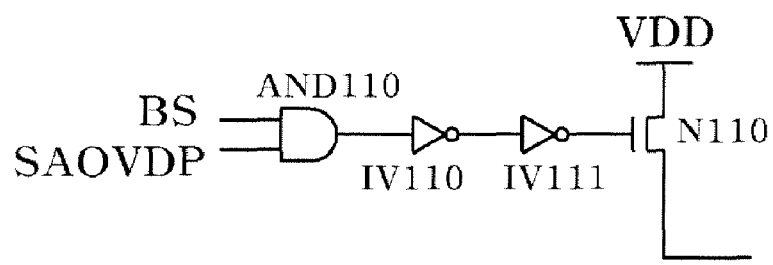
FIG. 5 is a circuit diagram illustrating a sense amplifier overdriving circuit according to another embodiment.

Although the PMOS transistor P110 is used as a voltage driver to supply the external voltage VDD, and the NAND gate ND100 is used as a logic gate in the illustrated embodiment, an NMOS transistor N110 may be used as the voltage driver to supply the external voltage VDD, and an AND gate AND110, which performs an AND operation, may be used as the logic gate, as shown in FIG. 5.

As apparent from the above description, in the sense amplifier overdriving circuit and the semiconductor device using the sense amplifier over driving circuit, sense amplifiers are overdriven at the level of the external voltage for a predetermined period to prevent the internal voltage of the sense amplifiers from being abruptly dropped during operation of the sense amplifiers in such a manner that the overdriving operation is carried out only for the sense amplifiers belonging to a currently-activated cell block, and a semiconductor device using the sense amplifier overdriving circuit.

What is claimed is:

1. A sense amplifier overdriving circuit comprising:
a first voltage driver to supply an internal voltage from an internal voltage terminal to a sense amplifier in response to a first enabling signal;
a logic unit to logically operate a block select signal for selection of a cell block and a second enabling signal enabled for a predetermined time after enabling of the first enabling signal, and outputs the resultant signal; and
a second voltage driver which supplies an external voltage to the internal voltage terminal in response to the signal output from the logic unit
wherein the second voltage driver is turned on when both the block select signal and the second enabling signal are enabled, and the logic unit ANDs the block select signal and the second enabling signal.

2. The sense amplifier overdriving circuit according to claim 1, wherein the logic unit NANDs the block select signal and the second enabling signal.

3. The sense amplifier overdriving circuit according to claim 2, wherein the second voltage driver is a p-channel metal oxide semiconductor (PMOS) device.

4. The sense amplifier overdriving circuit according to claim 3, wherein the second voltage driver is an n-channel metal oxide semiconductor (NMOS) device.

5. The sense amplifier overdriving circuit according to claim 1, wherein the first enabling signal is a sense amplifier enabling signal to control operation of the sense amplifier.

6. The sense amplifier overdriving circuit according to claim 1, wherein the second enabling signal is a sense amplifier overdriving signal to control overdriving of the sense amplifier enablement.

7. A semiconductor device comprising a plurality of sense amplifier overdriving circuits each adapted to overdrive sense amplifiers at an external voltage level for a predetermined period, so as to prevent an abrupt drop in internal voltage during operation of the sense amplifiers, wherein each of the sense amplifier overdriving circuits comprises:
a first voltage driver to supply an internal voltage from an internal voltage terminal to at least one of the sense amplifiers associated with the sense amplifier overdriving circuit in response to a first enabling signal;
a logic unit to logically operate a block select signal for selection of a cell block and a second enabling signal enabled for a predetermined time after enabling of the first enabling signal, and outputs the resultant signal; and a second voltage driver to supply an external voltage to the internal voltage terminal in response to the signal output from the logic unit,
wherein the second voltage driver is turned on when both the block select signal and the second enabling signal are enabled, and the logic unit ANDs the block select signal and the second enabling signal.

8. The semiconductor device according to claim 7, wherein the logic unit NANDs the block select signal and the second enabling signal.

9. The semiconductor device according to claim 8, wherein the second voltage driver is a p-channel metal oxide semiconductor (PMOS) device.

10. The semiconductor device according to claim 9, wherein the second voltage driver is an n-channel metal oxide semiconductor (NMOS) device.

11. The semiconductor device according to claim 7, wherein the first enabling signal is a sense amplifier enabling signal to control operation of the sense amplifier.

12. The semiconductor device according to claim 7, wherein the second enabling signal is a sense amplifier overdriving signal to control overdriving of the sense amplifier enablement.

* * * * *